US011610971B2

(12) United States Patent
Dasgupta et al.

(10) Patent No.: US 11,610,971 B2
(45) Date of Patent: Mar. 21, 2023

(54) CAP LAYER ON A POLARIZATION LAYER TO PRESERVE CHANNEL SHEET RESISTANCE

(71) Applicant: Intel Corporation, Santa Clara, CA (US)

(72) Inventors: Sansaptak Dasgupta, Hillsboro, OR (US); Marko Radosavljevic, Portland, OR (US); Han Wui Then, Portland, OR (US); Nidhi Nidhi, Hillsboro, OR (US); Rahul Ramaswamy, Portland, OR (US); Johann Rode, Hillsboro, OR (US); Paul Fischer, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 947 days.

(21) Appl. No.: 16/222,976

(22) Filed: Dec. 17, 2018

(65) Prior Publication Data
US 2020/0194552 A1 Jun. 18, 2020

(51) Int. Cl.
| | |
|---|---|
| *H01L 29/205* | (2006.01) |
| *H01L 29/10* | (2006.01) |
| *H01L 29/778* | (2006.01) |
| *H01L 29/20* | (2006.01) |
| *H01L 21/02* | (2006.01) |
| *H01L 29/66* | (2006.01) |
| *H01L 21/762* | (2006.01) |
| *H01L 29/08* | (2006.01) |
| *H01L 29/423* | (2006.01) |
| *H01L 29/207* | (2006.01) |

(52) U.S. Cl.
CPC ........ *H01L 29/205* (2013.01); *H01L 21/0217* (2013.01); *H01L 21/0254* (2013.01); *H01L 21/02458* (2013.01); *H01L 21/76224* (2013.01); *H01L 29/0847* (2013.01); *H01L 29/1033* (2013.01); *H01L 29/2003* (2013.01); *H01L 29/207* (2013.01); *H01L 29/4236* (2013.01); *H01L 29/42376* (2013.01); *H01L 29/66462* (2013.01); *H01L 29/7787* (2013.01)

(58) Field of Classification Search
None
See application file for complete search history.

(56) References Cited

U.S. PATENT DOCUMENTS

| | | | | |
|---|---|---|---|---|
| 9,231,064 | B1* | 1/2016 | Reza | H01L 21/2654 |
| 9,337,278 | B1* | 5/2016 | Gu | H01L 24/83 |
| 2008/0296618 | A1* | 12/2008 | Suh | H01L 29/432 |
| | | | | 257/190 |
| 2012/0315742 | A1* | 12/2012 | Yui | H01L 21/0262 |
| | | | | 257/E21.097 |
| 2013/0141156 | A1* | 6/2013 | Teo | H01L 29/7783 |
| | | | | 257/E29.246 |

(Continued)

*Primary Examiner* — Scott B Geyer
(74) *Attorney, Agent, or Firm* — Schwabe, Williamson & Wyatt, P.C.

(57) ABSTRACT

An integrated circuit structure comprises a base layer that includes a channel region, wherein the base layer and the channel region include group III-V semiconductor material. A polarization layer stack is over the base layer, wherein the polarization layer stack comprises a buffer stack, an interlayer over the buffer stack, a polarization layer over the interlayer. A cap layer stack is over the polarization layer to reduce transistor access resistance.

19 Claims, 10 Drawing Sheets

(56) References Cited

U.S. PATENT DOCUMENTS

| | | | |
|---|---|---|---|
| 2013/0313561 A1* | 11/2013 | Suh | H01L 29/7787 257/E21.403 |
| 2014/0264379 A1* | 9/2014 | Kub | H01L 29/365 257/77 |
| 2014/0264441 A1* | 9/2014 | Murase | H01L 29/66462 257/190 |
| 2015/0187924 A1* | 7/2015 | Dasgupta | H01L 29/7783 438/172 |
| 2017/0373168 A1* | 12/2017 | Ozaki | H01L 21/02178 |
| 2018/0090577 A1* | 3/2018 | Makiyama | H03F 1/3247 |
| 2019/0035895 A1* | 1/2019 | Xie | H01L 29/0843 |
| 2019/0189757 A1* | 6/2019 | Makiyama | H01L 29/1033 |
| 2019/0206994 A1* | 7/2019 | Huang | H01L 29/6631 |
| 2019/0221660 A1* | 7/2019 | Dasgupta | H01L 29/66462 |

* cited by examiner

CAP LAYER ON A POLARIZATION LAYER TO PRESERVE CHANNEL SHEET RESISTANCE

TECHNICAL FIELD

Embodiments of the disclosure are in the field of integrated circuit structures and, in particular, III-V transistors having a cap layer stack on a polarization layer stack to preserve channel sheet resistance.

BACKGROUND

In the fields of wireless communication and power management, various components can be implemented using semiconductor devices such as transistors. For example, in radio frequency (RF) communication, the RF front end is a generic term for the circuitry between an antenna and a digital baseband system and the RF front end may include multiple transistor-based components, such as switches and amplifiers, to name some examples. Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can be used to bias the transistor.

One promising transistor technology for future RF products including in 5G is based on group III-nitrides (III-N), such as gallium nitride (GaN). However, this transistor technology faces fundamental difficulties in reducing access resistance to the GaN channel.

DESCRIPTION OF THE EMBODIMENTS

Figure 1:
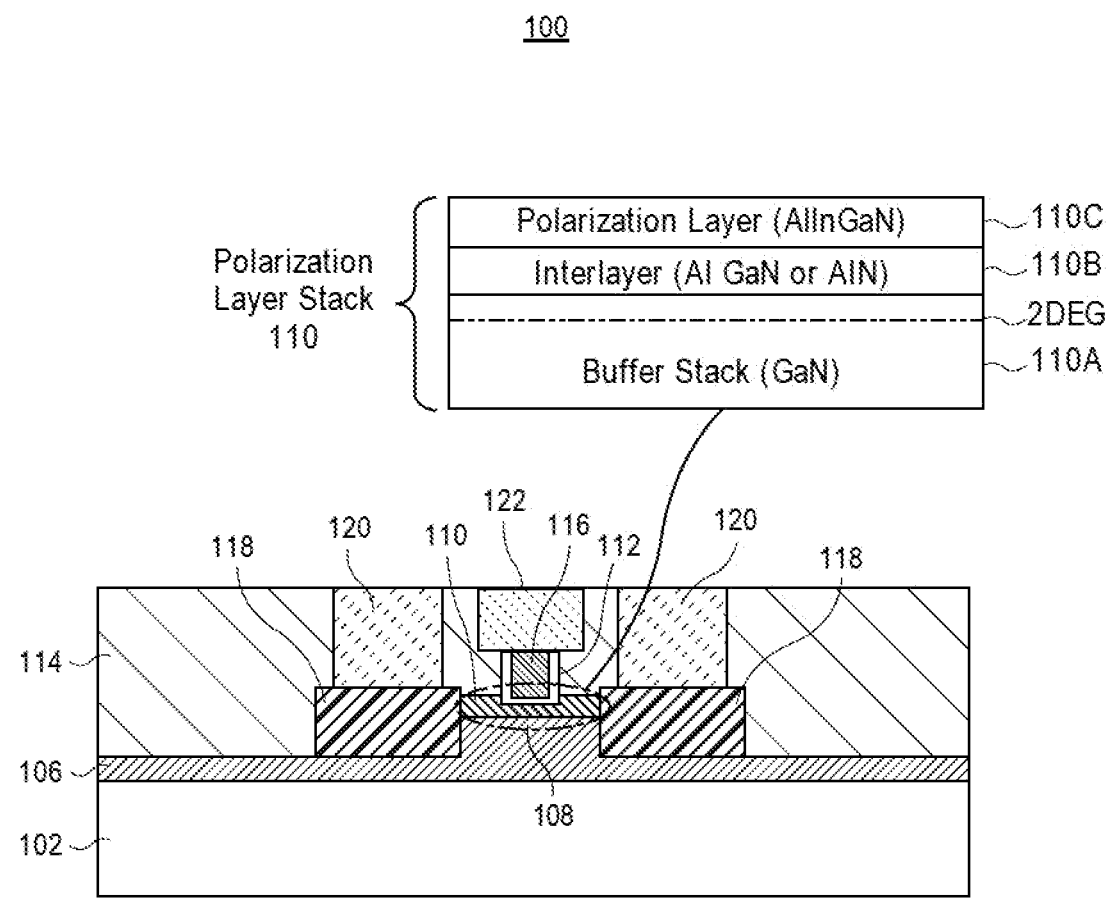
FIG. 1 is a cross-sectional view illustrating an integrated circuit structure comprising a III-V material, such as gallium nitride (GaN).

III-V transistors having a cap layer stack on a polarization layer stack to preserve channel sheet resistance are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to structures and architectures for fabricating III-N transistors, such as gallium nitride (GaN) transistors having an additional cap layer on a polarization layer to preserve channel sheet resistance. The cap layer on the polarization layer enable higher performance, by reducing access region, channel and S/D contact resistance needs. Lower resistances lead to lower ON state resistance (Ron) of the device and enables excellent high frequency performance. Embodiments may include or pertain to one or more of III-V transistors, GaN transistors, polarization layers, cap layers, and system-on-chip (SoC) technologies. One or more embodiments may be implemented to realize high performance RF switch applications of future technology nodes.

To provide context, FIG. 1 is a cross-sectional view illustrating an integrated circuit structure comprising a III-V material, such as gallium nitride (GaN). The transistor 100 includes a base substrate 102 and a GaN layer 106 over the substrate. The GaN layer 106 forms a channel region 108 of the transistor 100, and over the GaN layer 106 is an epitaxially grown polarization layer stack 110. A gate dielectric layer 112, such as silicon dioxide and/or high-k dielectric material and a gate electrode 116 are over the polarization layer stack 110. Gate electrode 116 may include any suitable material, such as polysilicon, silicon nitride, silicon carbide, and/or various suitable metal material, such as aluminum (Al), tungsten (W), titanium (Ti), tantalum (Ta), copper (Cu), titanium nitride (TiN), or tantalum nitride (TaN), for example. Source/drain regions 118 are formed adjacent to opposite sides of the polarization layer stack 110 and the channel region 108. The transistor 100 further includes source/drain contacts 120 and a gate contact 122 formed through an insulating layer 114 and in contact with the source/drain regions 118 and the gate electrode 116, respectively.

The enlarged view of the polarization layer stack 110 shows that in a typical embodiment, the polarization layer stack 110 may include various layers including a buffer stack 110A comprising GaN, an interlayer 110B comprising AlGaN or AlN, and a polarization layer 110C comprising AlInGaN, for example. One purpose of the polarization layer stack 110 is to increase carrier mobility in the transistor channel region 108 and/or be used to form a two-dimensional electron gas (2DEG) configuration at the interface between the interlayer 110B and the buffer stack 110A (as shown by the dashed line).

GaN transistors are potential candidates for future RF products, such as in 5G. In order to enable higher performance, access region, channel and S/D contact resistance needs to be reduced. Lower resistances lead to lower Ron of the device and enables excellent high frequency performance.

Figure 2A:
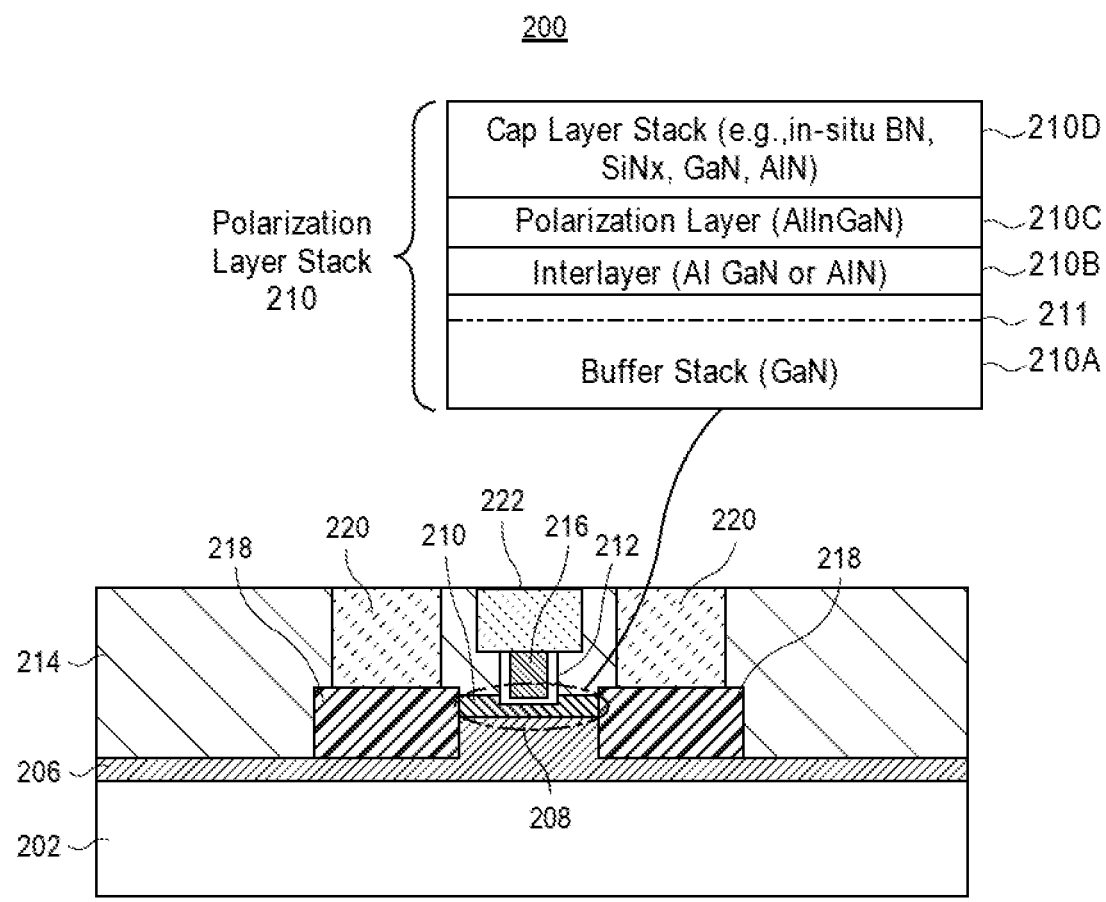
FIG. 2A is a cross-sectional view illustrating an integrated circuit structure comprising a III-V semiconductor material, such as gallium nitride (GaN) with an improved polarizations stack to reduce resistance in accordance with one embodiment.

FIG. 2A is a cross-sectional view illustrating an integrated circuit structure comprising a III-V semiconductor material, such as gallium nitride (GaN) with an improved polarization stack to reduce resistance in accordance with one embodiment. In one embodiment, the transistor 200 may be used as a field-effect transistor (FET) in various components of an RF front end of a mobile device RF and/or RF base stations. The transistor 200 includes a base layer 206 over an optional substrate 202. In this example embodiment, base layer 206 forms a channel region 208 of the transistor 200. A polarization layer stack 210 is over the base layer 206. A gate dielectric layer 212, such as silicon dioxide and/or high-k dielectric material and a gate electrode 216 are over the polarization layer 210. Gate electrode 216 may include any suitable material, such as polysilicon, silicon nitride, silicon carbide, and/or various suitable metal material, such as aluminum (Al), tungsten (W), titanium (Ti), tantalum (Ta), copper (Cu), titanium nitride (TiN), or tantalum nitride (TaN), for example. Source/drain (S/D) regions 218 are formed adjacent to opposite sides of the polarization layer stack 210 and the channel region 208. The transistor 200 further includes source/drain contacts 220 and a gate contact 222 formed through an insulating layer 214 and in contact with the source/drain regions 218 and the gate electrode 216, respectively.

Substrate 202 is optional because in some embodiments, the base layer 206 may be a bulk wafer, such that the base layer 206 is not formed above or on another material substrate but is instead used as the substrate itself, for example. However, in the example stack of layers shown in FIG. 2A, substrate 202 is present and base layer 206 is formed above substrate 202. Substrate 202, in some embodiments, may include a bulk substrate including a group IV material, such as silicon (Si), germanium (Ge), SiGe, or silicon carbide (SiC), and/or at least one group III-V material and/or sapphire and/or any other suitable material(s).

Base layer 206, in some embodiments, may include any suitable material, including group III-V material, and more specifically in some embodiments, one or more III-N materials, for example, such as GaN, GaAs, InGaAs, InGaN, and/or any other suitable material. In some embodiments, group III element-nitride (III-N) material may be particularly well-suited for base layer 206, as III-N materials have high (or wide) bandgaps and other desirable properties that serve well for the channel material of an RF switch transistor, for example. III-N materials, as variously used herein, include a compound of one or more group III materials (e.g., aluminum, gallium, and/or indium), with nitrogen. Accordingly, III-N materials as variously used herein include, but are not limited to, GaN, InN, AlN, AlInN, AlGaN, InGaN, and AlInGaN. In some embodiments, base layer 206 may have a multilayer structure including multiple material layers. In some embodiments, base layer 206 may or may not include grading (e.g., increasing and/or decreasing) the content of one or more materials in at least a portion of the layer. In some embodiments, base layer 206 may be formed to have a thickness between 10 nm and 2 microns, or any other suitable thickness, depending on the end use or target application. In embodiments where substrate 202 is not present and base layer 206 is a bulk wafer, then base layer 206 may be substantially thicker, such as greater than 100 microns in thickness, for example.

In some embodiments, an optional buffer layer (not shown) may be located between the base layer 206 and the substrate 202 when present. In the case where the buffer layer 206 is a III-V material and formed on the substrate 202 that is a non-III-V material (e.g., Si, Ge, SiGe, SiC, or sapphire substrate), the buffer layer may act to improve growth conditions and/or prevent the III-V base layer 206 from reacting with the non-III-V substrate material.

Polarization layer stack 210, in some embodiments, may be formed using any suitable techniques, as will be apparent in light of the present disclosure. In some embodiments, polarization layer stack 210 may include any suitable materials, such as one or more III-V materials, and more specifically in some embodiments, one or more III-N materials, for example.

The enlarged view of the polarization layer stack 210 shows that the polarization layer stack 210 may comprise various layers including buffer stack 210A, an interlayer 210B over the buffer stack 210A, and a polarization layer 210C over the interlayer 210B. In one embodiment, the buffer stack 210A may comprise a portion of the base layer 206 in the channel region 208. In some embodiments, the polarization layer stack 210 may include aluminum and nitrogen, such that one or more of the interlayer 210B and the polarization layer 210C comprise at least one of AlN, AlGaN, and AlInGaN, for instance. For example, in one embodiment, the buffer stack 210A comprises a III-N semiconductor material, such as GaN, the interlayer 210B may comprise a material such as AlGaN or AlN, and a polarization layer 210C comprises AlInGaN.

In some embodiments, polarization layer stack 210 may increase carrier mobility in the channel region 208 and/or be used to form two-dimensional electron gas (2DEG) configurations 211 with the underlying III-V base layer 206, for example. Although 2DEG configurations include electron carriers and two-dimensional hole gas (2DHG) configurations 211 including hole carriers, the term 2DEG will be used herein to generally refer to both carrier type configurations (both electron and hole carriers) for ease of description, unless otherwise stated. Therefore, in some instances, the 2DEG configurations 211, when the transistor 200 is in an ON state (as indicated in FIG. 2A), may be considered a part of the channel region 208, as the 2DEG configurations 211 (along with channel region 208) allow charge carriers (e.g., electrons or holes) to flow from one source/drain (S/D) region 218 to the other, depending on the end use or target application. In some cases, the thickness and/or composition of polarization layer stack 210 may affect the magnitude of a polarization vector formed, and thus the amount of charge (and corresponding conductivity) in the 2DEG configurations 211, for example.

According the disclosed embodiments, the polarization layer stack 210 is further provided with an additional in-situ cap layer stack 210D over the polarization layer 210C to reduce transistor access resistance by preserving, and in some cases, enhancing the properties of the 2DEG configuration 211 formed at the interface of the interlayer 210B and buffer stack 210A, and overall to decrease sheet resistance. In one embodiment, the cap layer stack 210D comprises one or more layers of material that are deposited in-situ in a GaN epitaxial (epi) chamber such that there is no resultant interface contamination/oxidized layer formation at the interface of the cap layer stack 210D and the polarization layer 210C. The presence of this cap layer stack 210D reduces, if not prevents, degradation of the polarization layer 210C during subsequent device processing steps and acts like a "protective" cap for the 2DEG. Without the cap layer stack 210D during device processing, the channel 2DEG resistance increases, and hence the cap layer stack 210D preserves the resistance.

In one embodiment, the cap layer stack 210D may comprise two or more of silicon, nitride, gallium, aluminum, and boron, including SiNx, GaN, AlN, BN, and the like. In one embodiment, the cap layer stack 210D may have thicknesses range of approximately 1-20 nm. In one embodiment, the interlayer 210B may have a thickness range of approximately 5-7 nm, and the polarization layer 210C may have a thickness range of approximately 5-20 nm.

Source and drain (S/D) regions 218, in some embodiments, may be formed using any suitable techniques, depending on the end use or target application. As shown in the example structure of FIG. 2A, S/D regions 218 are grown (or regrown) from polarization layer stack 210 as that layer may have provided a relatively high-quality growth surface, particularly where the S/D regions 218 include III-V material, for example. However, any suitable techniques may have been used to form S/D regions 218. In some embodiments, S/D regions 218 may include any suitable material and any suitable doping scheme, such as being n-type doped or p-type doped using appropriate techniques and materials based on the S/D material and depending on the end use or target application. For example, where base layer 206 includes III-V material, such as GaN or InGaN, S/D regions 218 may both include n-type doped InN or InGaN (e.g., where Si is the n-type dopant). In some embodiments, S/D regions 218 may have a multi-layer structure including multiple material layers. For instance, in some embodiments, a passivation material may be deposited prior to the deposition of the primary S/D material to assist with the quality of the interface between the S/D regions 218 and the base layer 206 material. Further, in some embodiments, a contact-improving material may be formed on the top of the S/D regions 218 to assist with making contact to S/D regions 218 and S/D contacts 220 and gate contact 222 (described below). For example. In another example embodiment, where base layer 206 includes Si and the transistor device is configured to be a PMOS device, S/D regions 218 may both include p-type doped Si (e.g., where boron is the p-type dopant). In another example embodiment, where base layer 206 includes Si and the transistor device is configured to be an MOS device, S/D regions 218 may both include n-type doped Si (e.g., where phosphorus is the n-type dopant). In some embodiments, S/D regions 218 may include grading (e.g., increasing and/or decreasing) the content of one or more materials in at least a portion of the regions.

S/D regions 218 and S/D contacts 220 and gate contact 222, in some embodiments, may be formed using any suitable techniques, depending on the end use or target application. In some embodiments, S/D regions 218 and S/D contacts 220 and gate contact 222 may include any suitable material, such as a conductive metal or alloy (e.g., aluminum, tungsten, silver, titanium, nickel-platinum, or nickel-aluminum). In some embodiments, S/D regions 218 and S/D contacts 220 and gate contact 222 may include a resistance reducing metal and a contact plug metal, or just a contact plug, depending on the end use or target application. Example contact resistance reducing metals may include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the S/D contacts 220, such as adhesion layers (e.g., titanium nitride) and/or liner or barrier layers (e.g., tantalum nitride), if so desired. In some embodiments, metallization of the S/D regions 218 and S/D contacts 220 and gate contact 222 may be carried out, for example, using an alloying, silicidation, or germanidation process (e.g., generally, deposition of contact metal followed by annealing). Numerous S/D configurations will be apparent in light of this disclosure.

Figure 2B:
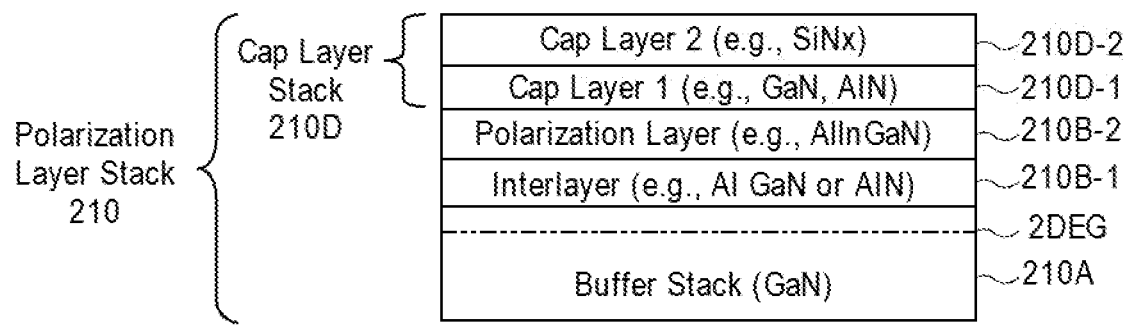
FIGS. 2B and 2C illustrate various layers comprising a cap layer stack according to different embodiments.
Figure 2C:
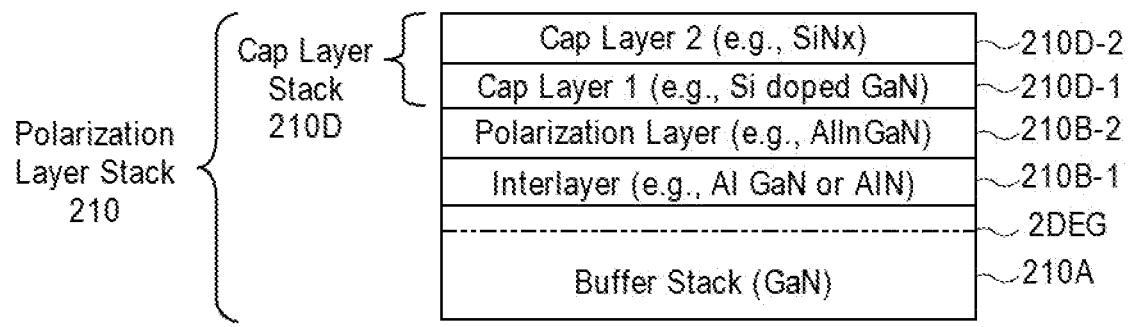

FIGS. 2B and 2C illustrate various layers comprising the cap layer stack 210D in different binary cap layer embodiments. FIG. 2B shows an embodiment, where the cap layer stack 210D comprises a first cap layer 210D-1 made of a III-N material, such as GaN, and a second cap layer 210D-2, which may comprise a dielectric such as SiNx in some embodiments.

FIG. 2C shows a further embodiment where the cap layer stack 210D comprises a first doped cap layer 210D-1 comprising a doped layer of a III-V material, and a second cap layer 210D-2 comprising a dielectric such as SiNx. The first doped cap layer 221D-1 may be delta-doped or doped entirely with a Si dopant to enhance the charge in the 2DEG and hence lower the sheet resistance (Rsh) of the access region of the transistor 200. For example, in one embodiment, the first cap layer 221D-1 may be provided by introducing an N-type dopant to a thin layer (e.g., 2-3 nm) of III-V material such as GaN at a level of 1-E19 to 1-E20 to increase channel charge.

Figure 3:
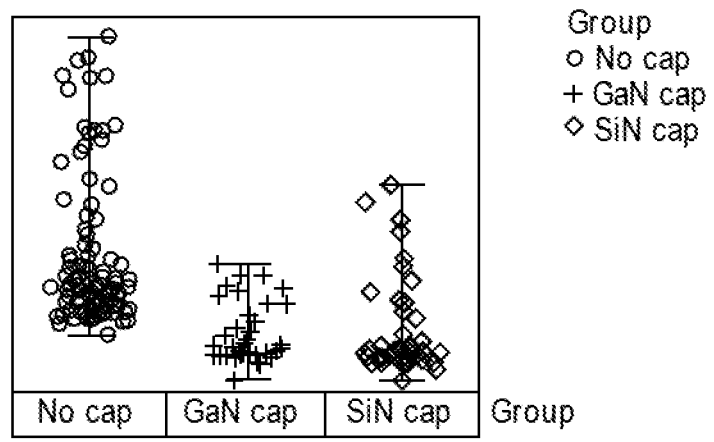
FIG. 3 is a box plot graph illustrating preservation/improvement of access region resistance of the transistor when provided with the polarization stack having one or more capping layers of the disclosed embodiments.

FIG. 3 is a box plot graph illustrating the preservation/improvement of access region resistance of the transistor 200 when provided with the polarization stack having one or more capping layers of the disclosed embodiments. The Y-axis shows the sheet resistance of the transistor access region, while the X-axis shows box plots of the transistor with, with a cap layer comprising GaN and a cap layer comprising SiN, respectively. Compared to a sheet resistance of a transistor with no cap, the transistors having a cap layer reduce the sheet resistance by approximately 50%.

Figure 4A:
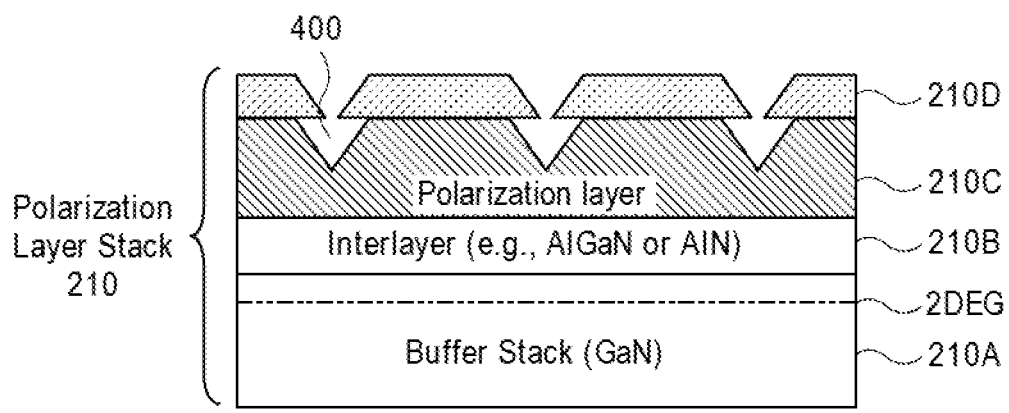
FIGS. 4A and 4B are cross-sectional views showing optional embodiments for surfaces of the cap layers comprising the cap layer stack.
Figure 4B:
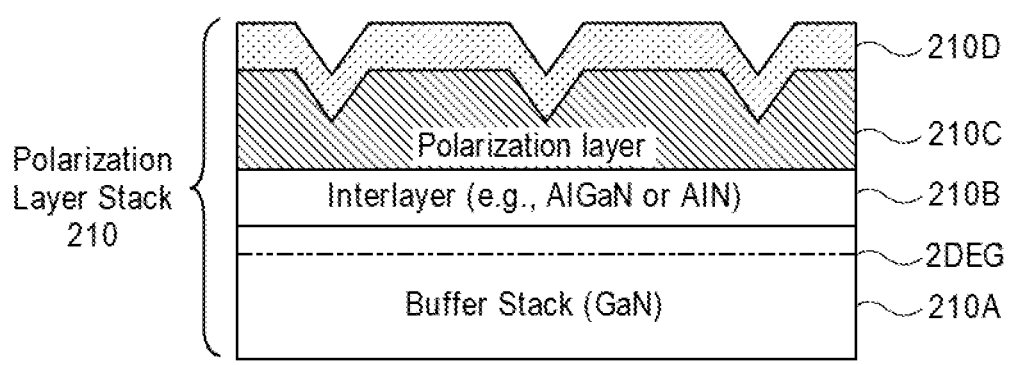

FIGS. 4A and 4B are cross-sectional views showing optional embodiments for surfaces of the cap layers comprising the cap layer stack. As a result of the fabricating the polarization layer stack 210, the surface of the polarization layer 210C may have various pits and defects 400, as shown. According to a further aspect of the disclosed embodiments, different process temperatures and conditions may be used for the capping layer sack 210D, such that the surface the capping layer 210D is either i) grown in a way that the capping layer 210D does not fill the pits and defects 400, as shown in FIG. 4A, or ii) deposited such that capping layer 210D conforms to surfaces of the pits and defects 400, as shown in FIG. 4B. Hence, unique cap layer surfaces may be obtained.

The structure of FIGS. 2A-2C and 4A-4B are primarily depicted and described herein in the context of a planar FET configuration. However, in some embodiments, other transistor configurations can benefit from the techniques described herein. For example, the techniques may be used to form transistors having non-planar configurations, such as finned or finFET configurations (e.g., including a dual-gate or tri-gate configuration) or gate-all-around configurations (e.g., including one or more nanowires or nanoribbons). Further, in some embodiments, the techniques can be used to form numerous different types of transistors, such as MOSFETs, tunnel-FETs (TFETs), high-electron-mobility transistors (HEMTs), or other suitable transistor architectures, depending on the end use or target application. Further yet, in some embodiments, the techniques can be used to form integrated circuits including p-channel and/or n-channel transistor devices, such as p-channel MOSFET (PMOS), n-channel MOSFET (NMOS), p-channel TFET (PTFET), n-channel TFET (NTFET), p-channel HEMT (PHEMT), and/or n-channel HEMT (NHEMT), to name some examples. Further still, in some embodiments, the techniques may be used to benefit either or both of p-channel and n-channel transistors included in complementary MOS (CMOS) or complementary TFET (CTFET) devices, for example. In some embodiments, the techniques may be used to benefit devices of varying scales, such as transistor devices having critical dimensions in the micrometer range or in the nanometer range (e.g., transistors formed at the 32, 22, 14, 10, 7, or 5 nm process nodes, or beyond).

In one embodiment, a process for fabricating III-V transistors, such as gallium nitride (GaN) transistors, having an additional cap layer on a polarization layer stack to preserve channel sheet resistance may include forming a base layer that includes a channel region, wherein the base layer and the channel region include group III-V semiconductor material. A polarization layer stack is formed over the base layer, wherein the polarization layer stack may comprise a buffer stack, an interlayer over the buffer stack, a polarization layer over the interlayer. A cap layer stack is formed over the polarization layer to reduce transistor access resistance.

FIGS. 5A-5G illustrate cross-sectional views showing a process for fabricating a GaN transistor having an additional cap layer on a polarization layer in further detail according to one example embodiment.

Figure 5A:
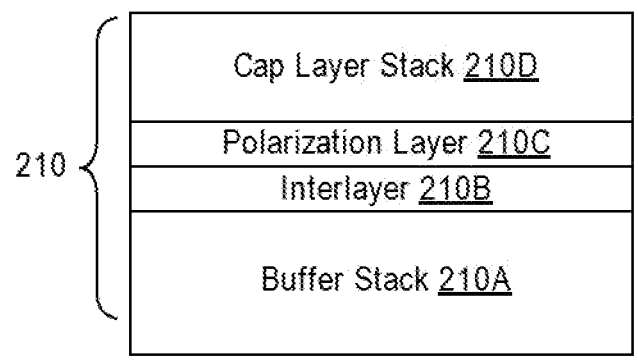
FIGS. 5A-5G illustrate cross-sectional views showing a process for fabricating a GaN transistor having an additional cap layer on a polarization layer in further detail according to one example embodiment.
Figure 5B:
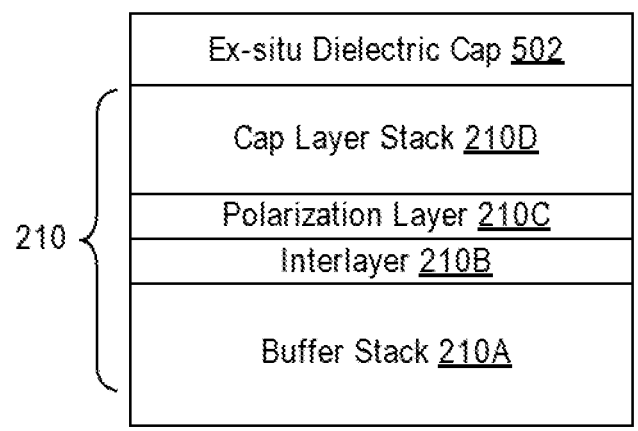
Figure 5C:
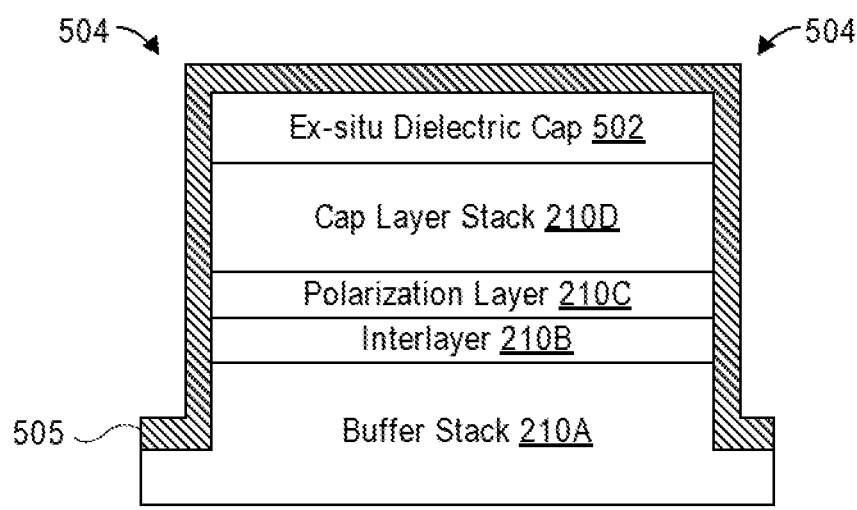

FIG. 5A illustrates the fabrication process of the GaN transistor after the polarization layer stack 210 is formed with protective cap layer stack 210D corresponding to FIG. 2A. It should be noted that the cap layer stack 210D is grown in an epi chamber in-situ with the rest of the polarization layer stack to eliminate any defects on the polarization layer 210C. FIG. 5B illustrates the fabrication process after an ex-situ dielectric cap 502 is formed over the polarization layer stack 210. FIG. 5C illustrates the fabrication process after shallow trench isolation (STI) is performed on the polarization layer stack 210 to form source/drain trenches 504 adjacent opposite sides of the polarization layer stack 210, and forming one or more dielectric materials 505 along the bottom and sides of the trenches 504 and over the polarization layer stack 210.

Figure 5D:
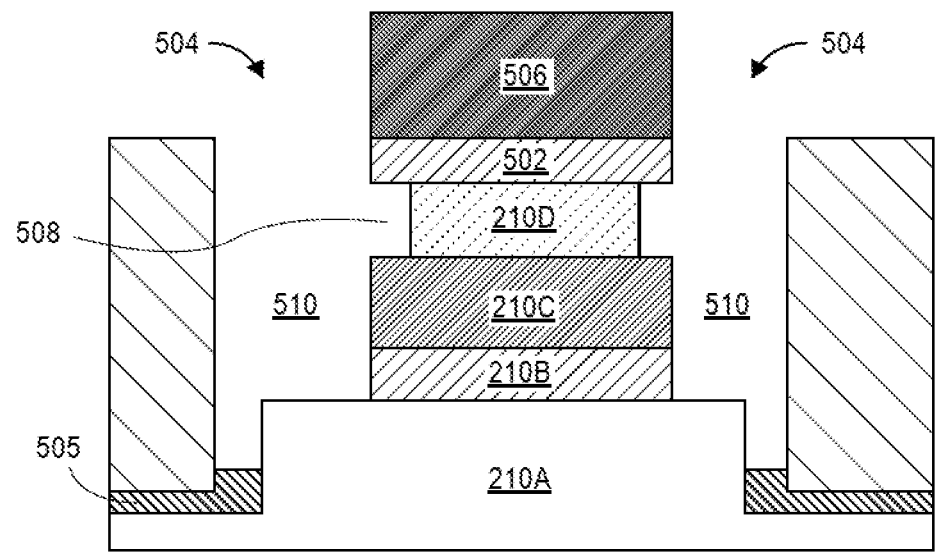
Figure 5E:
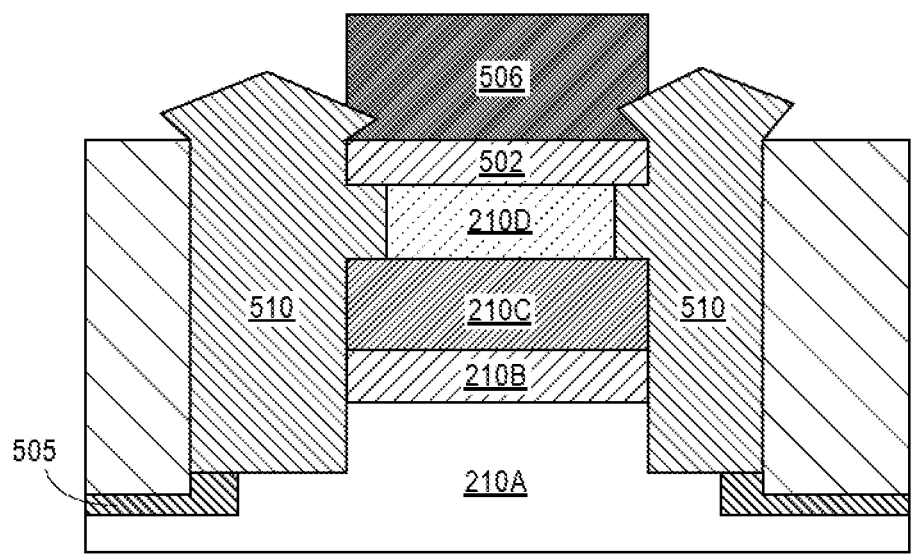
Figure 5F:
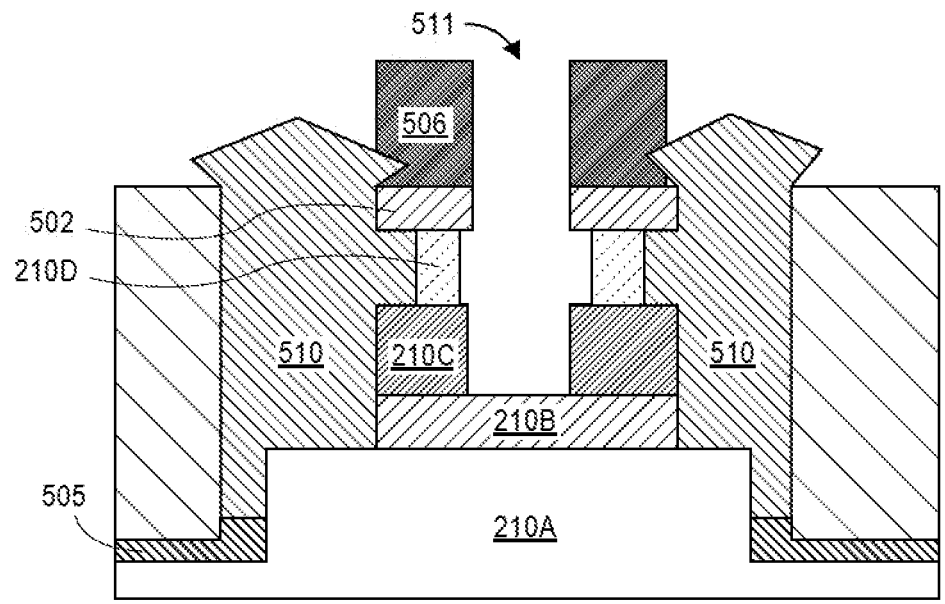
Figure 5G:
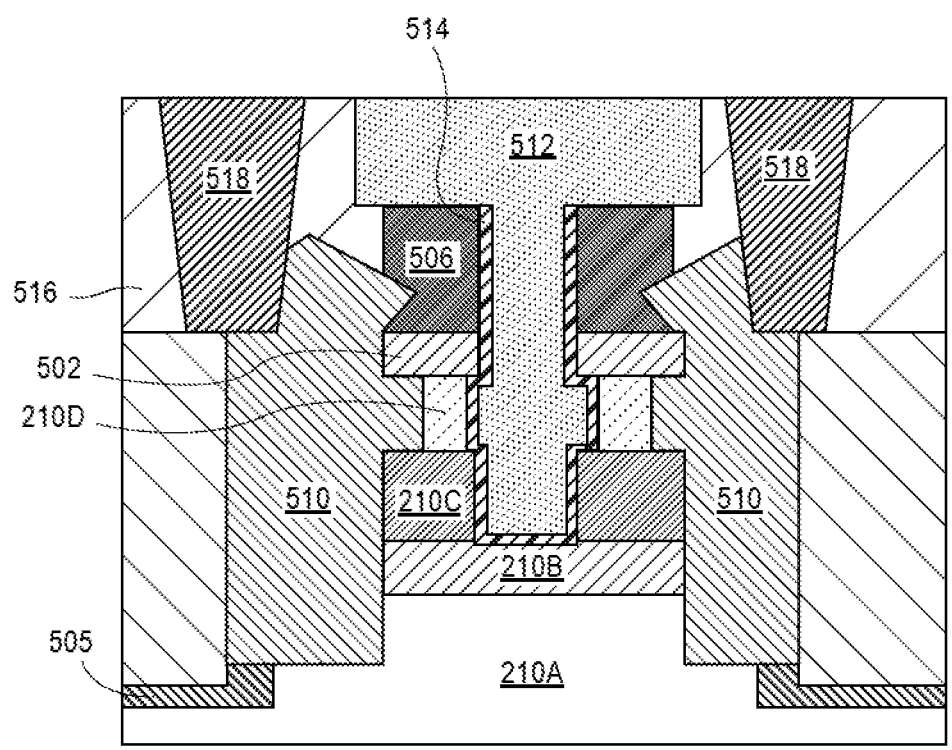

FIG. 5D illustrates the fabrication process to how advantage can be made of the binary cap layers, i.e., cap layer stack 210D and ex-situ dielectric cap 502, by forming a hardmask 506 on top of the polarization layer stack 210 and forming a source/drain epitaxial undercut (EUC) on cap layer stack 210D to form a first recess 508 on an outside of the cap layer stack 210D. FIG. 5E illustrates the fabrication process after n-type source/drain regions 510 are formed in the source/drain trenches 504. Due to the recess 508 in the cap layer stack 210D, the source/drain regions 510 form an overhang over and on the first recess 508 in the polarization layer 210C. FIG. 5F illustrates the fabrication process after a gate trench 511 is formed during replacement gate (RMG) gate formation through the hardmask 506 and the polarization layer stack 210 such that a second recess is formed in an interior of the cap layer stack 210D. FIG. 5G illustrates the fabrication process after a T-gate stack 512 is formed in the gate trench. This may include depositing an oxide layer 514 along sidewalls and bottom of the gate trench 511 and filling in the remainder of the gate trench with gate electrode material. Once an insulating layer 516 is formed over the integrated circuit structure, source/drain contacts 518 are formed in the insulating layer 516 in contact with the source/drain regions 510.

Due to the option of having two dissimilar materials as cap layer and a dielectric cap layer, a slight undercut can be obtained in the cap layer stack 210D using wet etch/isotropic dry etches. This gives rise to higher quality source drain regrowth films, and very low sheet resistance in the n-type source/drain regions 510. During the replacement metal gate process, a similar undercut in the cap layer stack 210D is created. Here the metals can fill the small void, and create a gate extension which can act as a "field plate" and hence reduce the critical field at gate edges. Depending on cap layer stack 210D or number of cap layers, this engineering can be done to create different gate profiles and edges.

The integrated circuit structures described herein may be included in an electronic device. As an example of one such apparatus, FIGS. 6A and 6B are top views of a wafer and dies that include one or more GaN transistor having an additional cap layer on a polarization layer, in accordance with one or more of the embodiments disclosed herein.

Figure 6B:
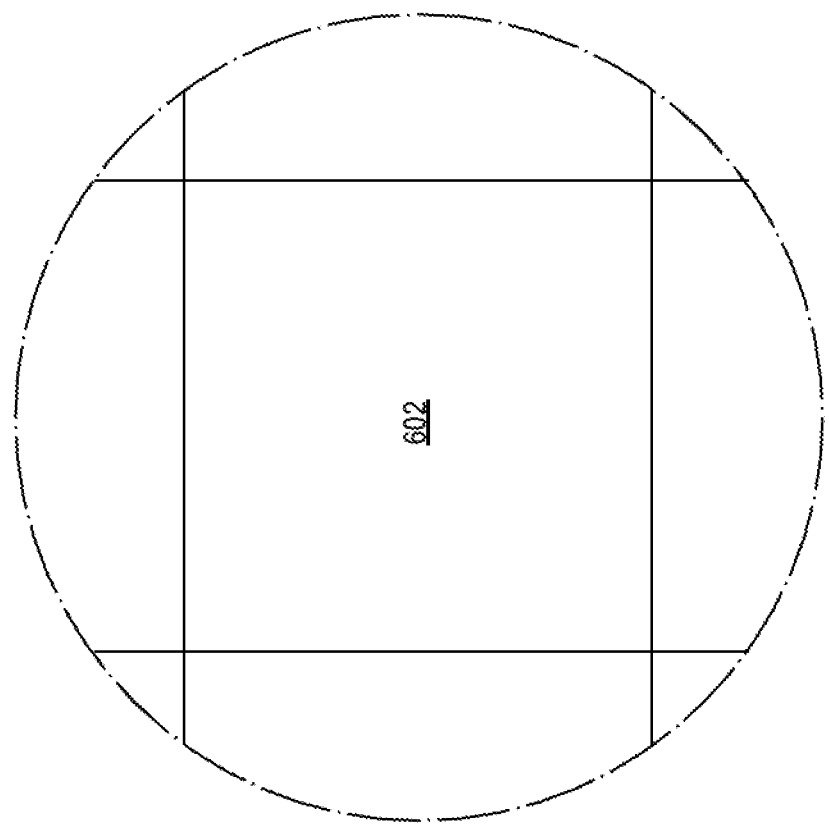
FIGS. 6A and 6B are top views of a wafer and dies that include one or more GaN transistor having an additional cap layer on a polarization layer, in accordance with one or more of the embodiments disclosed herein.
Figure 6A:
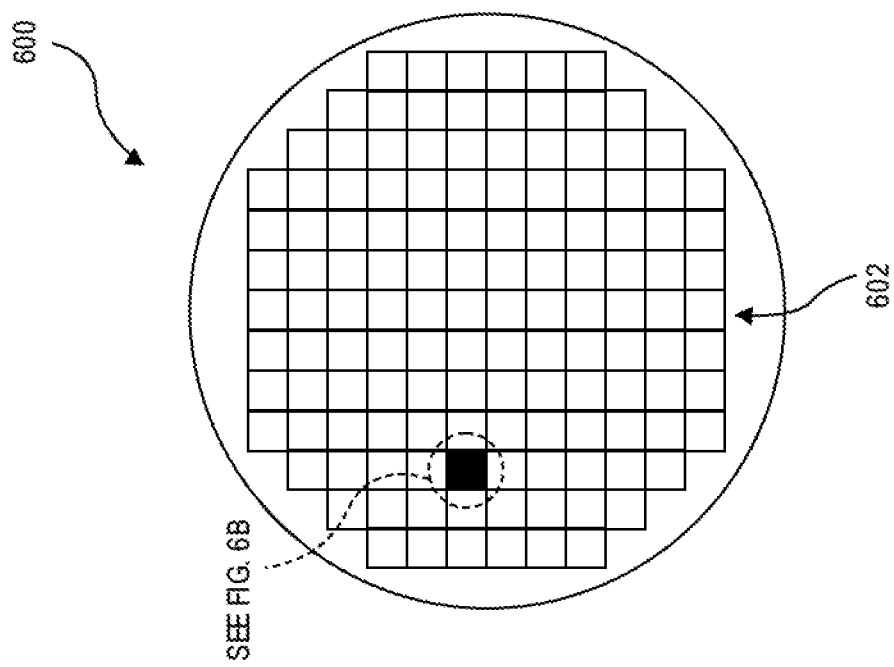

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more GaN transistor having an additional cap layer on a polarization layer, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
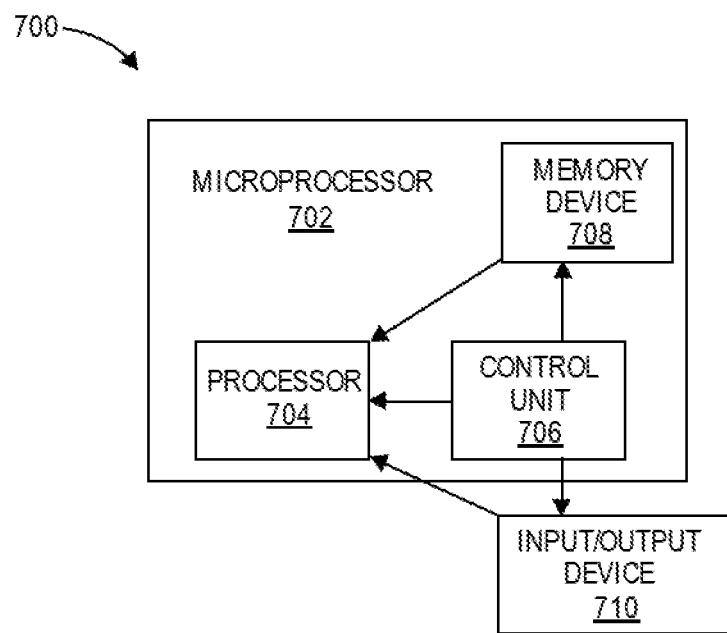
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more GaN transistor having an additional cap layer on a polarization layer, such as those described herein.

Figure 8:
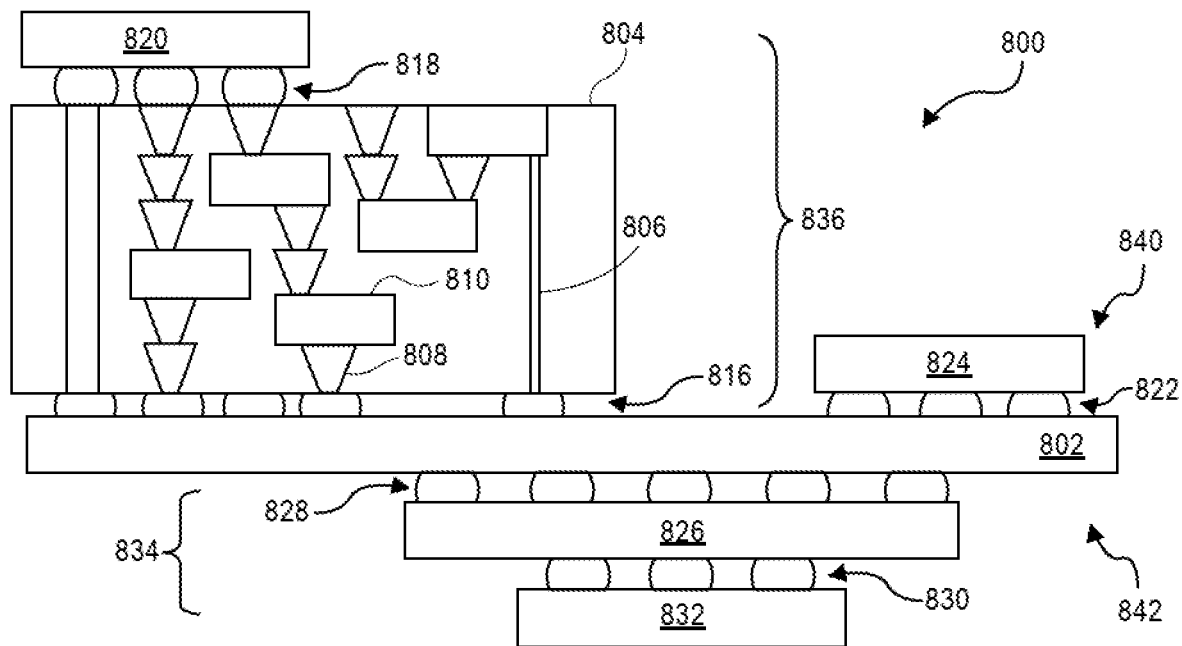
FIG. 8 is a cross-sectional side view of an integrated circuit (IC) device assembly that may include one or more GaN transistor having an additional cap layer on a polarization layer, in accordance with one or more of the embodiments disclosed herein.

FIG. 8 is a cross-sectional side view of an integrated circuit (IC) device assembly that may include one or more GaN transistor having an additional cap layer on a polarization layer, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of GaN transistor having an additional cap layer on a polarization layer, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
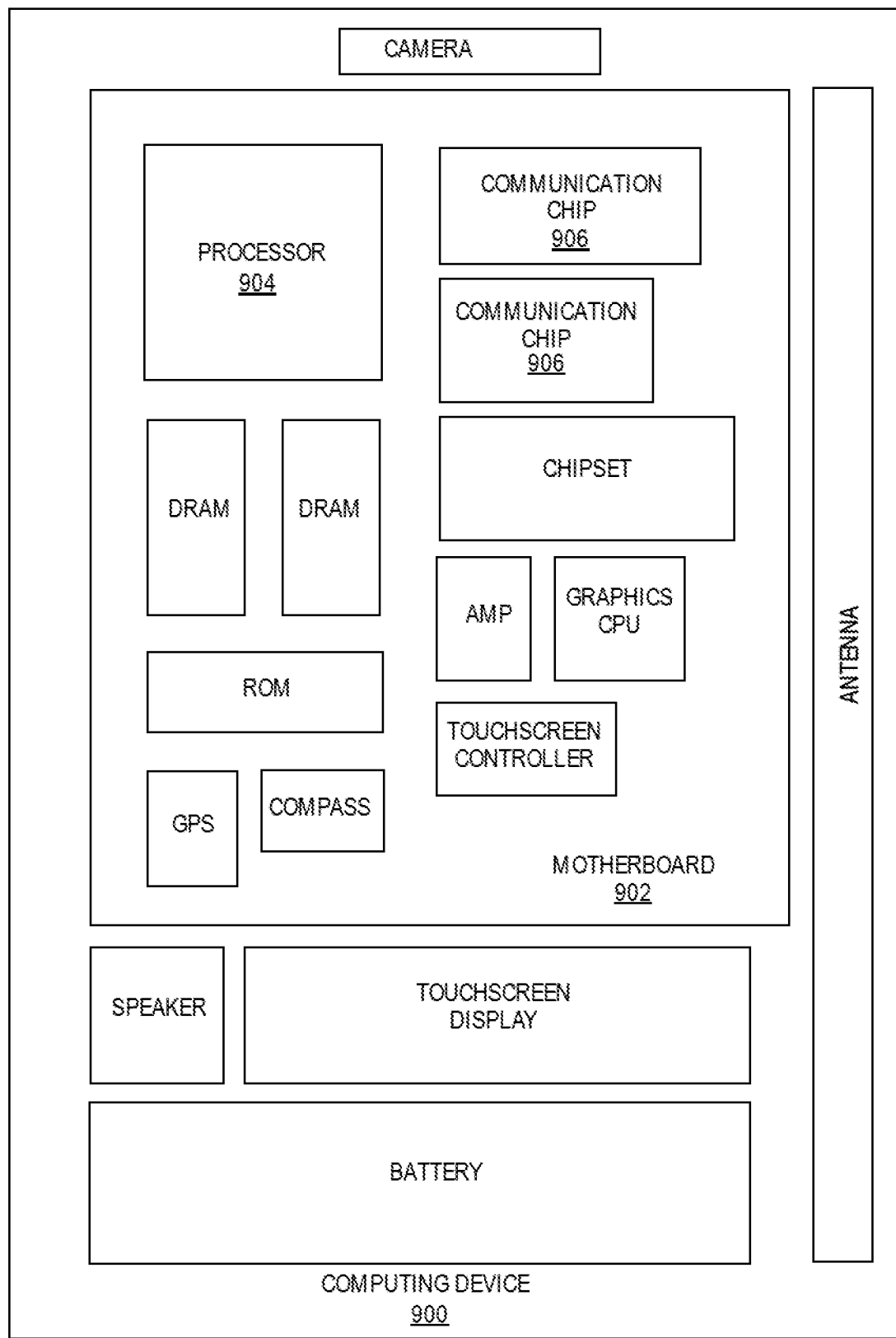
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more GaN transistor having an additional cap layer on a polarization layer, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more GaN transistor having an additional cap layer on a polarization layer, in accordance with implementations of embodiments of the disclosure.

In further implementations, another component housed within the computing device 900 may contain an integrated circuit die that includes one or more GaN transistor having an additional cap layer on a polarization layer, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include GaN transistor having an additional cap layer on a polarization layer.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises a base layer that includes a channel region, wherein the base layer and the channel region include group III-V semiconductor material. A polarization layer stack is over the base layer, wherein the polarization layer stack comprises a buffer stack, an interlayer over the buffer stack, a polarization layer over the interlayer. A cap layer stack is over the polarization layer to reduce transistor access resistance.

Example Embodiment 2

The integrated circuit structure of embodiment 1, wherein the cap layer stack reduces degradation of the polarization layer stack and comprises two or more of silicon, nitride, gallium, aluminum, and boron.

Example Embodiment 3

The integrated circuit structure of embodiment 2, wherein the cap layer stack comprises at least one of SiNx, GaN, AlN, and BN.

Example Embodiment 4

The integrated circuit structure of embodiment 2, wherein the cap layer stack comprises a first cap layer made of a III-N material, and a second cap layer comprising a dielectric.

Example Embodiment 5

The integrated circuit structure of embodiment 4, wherein the first cap layer is doped with a Si dopant.

Example Embodiment 6

The integrated circuit structure of embodiment 2, wherein the cap layer stack does not fill pits and defects of a top surface of the polarization layer stack.

Example Embodiment 7

The integrated circuit structure of embodiment 2, wherein the cap layer stack is conformal with the polarization layer stack and fills pits and defects of a top surface of the polarization layer stack.

Example Embodiment 8

The integrated circuit structure of embodiment 2, wherein the cap layer stack has a thickness range of approximately 1-20 nm.

Example Embodiment 9

The integrated circuit structure of embodiment 1, wherein the polarization layer stack comprises a buffer stack, an interlayer over the buffer stack, a polarization layer over the interlayer.

Example Embodiment 10

The integrated circuit structure of embodiment 9, wherein the buffer stack of the polarization layer stack comprises gallium and nitrogen, and the interlayer and the polarization layer of the polarization layer stack comprise aluminum and nitrogen.

Example Embodiment 11

The integrated circuit structure of embodiment 1, wherein the base layer and the channel region comprise gallium and nitrogen.

Example Embodiment 12

The integrated circuit structure of embodiment 1, wherein the cap layer stack reduces channel sheet resistance.

Example Embodiment 13

A transistor comprises a base layer that includes a channel region, wherein the base layer and the channel region comprise gallium and nitride. A polarization layer stack is over the base layer. A gate electrode is over the polarization layer stack. The polarization layer stack comprises a buffer stack, an interlayer over the buffer stack, a polarization layer over the interlayer, and a cap layer stack over the polarization layer to reduce transistor access resistance.

Example Embodiment 14

The transistor of embodiment 13, wherein the cap layer stack reduces degradation of the polarization layer stack and comprises two or more of silicon, nitride, gallium, aluminum, and boron.

Example Embodiment 15

The transistor of embodiment 14, wherein the cap layer stack comprises at least one of SiNx, GaN, AlN, and BN.

Example Embodiment 16

The transistor of embodiment 14, wherein the cap layer stack comprises a first cap layer made of a III-N material, and a second cap layer comprises a dielectric.

Example Embodiment 17

The transistor of embodiment 16, wherein the first cap layer is doped with a Si dopant.

Example Embodiment 18

The transistor of embodiment 14, wherein the cap layer stack does not fill pits and defects of a top surface of the polarization layer stack.

Example Embodiment 19

The transistor of embodiment 14, wherein the cap layer stack is conformal with the polarization layer stack and fills pits and defects of a top surface of the polarization layer stack.

Example Embodiment 20

The transistor of embodiment 14, wherein the cap layer stack has a thickness range of approximately 1-20 nm.

Example Embodiment 21

The transistor of embodiment 13, wherein the buffer stack of the polarization layer stack comprises gallium and nitrogen.

Example Embodiment 22

The transistor of embodiment 13, and the interlayer and the polarization layer of the polarization layer stack comprise aluminum and nitrogen.

Example Embodiment 23

The transistor of embodiment 13, wherein the cap layer stack reduces channel sheet resistance.

Example Embodiment 24

A method of fabricating a memory device comprises forming a base layer that includes a channel region, wherein the base layer and the channel region include group III-V semiconductor material. A polarization layer stack is formed over the base layer, wherein the polarization layer stack comprises a buffer stack, an interlayer over the buffer stack, a polarization layer over the interlayer. A cap layer stack is formed over the polarization layer to reduce transistor access resistance.

Example Embodiment 25

The method of embodiment 24 comprises forming at least a portion of the cap layer stack ex-situ. Shallow trench isolation is performed on the polarization layer stack to form source/drain trenches adjacent opposite sides of the polarization layer stack. A first recess is formed on an outside of the cap layer stack. N-type source/drain regions are formed in the source/drain trenches, such that the n-type source/drain regions form an overhang over and on the polarization layer. A gate trench is formed through the polarization layer stack, such that a second recess is formed in an interior of the cap layer stack. A T-gate stack is formed in the gate trench.

What is claimed is:

1. An integrated circuit structure, comprising:
 a base layer that includes a channel region, wherein the base layer and the channel region include group III-V semiconductor material;
 a polarization layer stack over the base layer; and
 a cap layer stack over the polarization layer stack, wherein the cap layer stack comprises a nitride compound of silicon, gallium, aluminum, or boron, and does not fill pits and defects of a top surface of the polarization layer stack.

2. The integrated circuit structure of claim 1, wherein the cap layer stack comprises at least one of SiNx, GaN, AlN, and BN.

3. The integrated circuit structure of claim 1, wherein the cap layer stack comprises a first cap layer made of a III-N material, and a second cap layer comprising a dielectric.

4. The integrated circuit structure of claim 3, wherein the first cap layer is doped with a Si dopant.

5. The integrated circuit structure of claim 1, wherein the cap layer stack has a thickness range of approximately 1-20 nm.

6. The integrated circuit structure of claim 1, wherein the polarization layer stack comprises a buffer stack, an interlayer over the buffer stack, and a polarization layer over the interlayer.

7. The integrated circuit structure of claim 6, wherein the buffer stack of the polarization layer stack comprises gallium and nitrogen, and the interlayer and the polarization layer of the polarization layer stack comprise aluminum and nitrogen.

8. The integrated circuit structure of claim 1, wherein the base layer and the channel region comprise gallium and nitrogen.

9. The integrated circuit structure of claim 1, wherein the cap layer stack reduces channel sheet resistance.

10. A transistor, comprising:
 a base layer that includes a channel region, wherein the base layer and the channel region comprise gallium and nitride;
 a polarization layer stack over the base layer;
 a gate electrode over the polarization layer stack; and
 source and drain regions adjacent to the channel region, wherein the polarization layer stack comprises a buffer stack, an interlayer over the buffer stack, a polarization layer over the interlayer, and a cap layer stack over the polarization layer, wherein the cap layer stack comprises a nitride compound of silicon, gallium, aluminum, or boron, and does not fill pits and defects of a top surface of the polarization layer stack.

11. The transistor of claim 10, wherein the cap layer stack comprises at least one of SiNx, GaN, AlN, and BN.

12. The transistor of claim 10, wherein the cap layer stack comprises a first cap layer made of a III-N material, and a second cap layer comprises a dielectric.

13. The transistor of claim 12, wherein the first cap layer is doped with a Si dopant.

14. The transistor of claim 10, wherein the cap layer stack has a thickness range of approximately 1-20 nm.

15. The transistor of claim 10, wherein the buffer stack of the polarization layer stack comprises gallium and nitrogen.

16. The transistor of claim 10, wherein the interlayer and the polarization layer of the polarization layer stack comprise aluminum and nitrogen.

17. The transistor of claim 10, wherein the cap layer stack reduces channel sheet resistance.

18. An integrated circuit structure, comprising:
 a base layer that includes a channel region, wherein the base layer and the channel region include group III-V semiconductor material;
 a polarization layer stack over the base layer; and
 a cap layer stack is conformal with the polarization layer stack, wherein wherein the cap layer stack comprises a nitride compound of silicon, gallium, aluminum, or boron, and fills pits and defects of a top surface of the polarization layer stack.

19. A transistor, comprising:
 a base layer that includes a channel region, wherein the base layer and the channel region comprise gallium and nitride;
 a polarization layer stack over the base layer;
 a gate electrode over the polarization layer stack; and
 source and drain regions adjacent to the channel region, wherein the polarization layer stack comprises a buffer stack, an interlayer over the buffer stack, a polarization layer over the interlayer, and a cap layer stack over the polarization layer, wherein the cap layer stack comprises a nitride compound of silicon, gallium, aluminum, or boron, and fills pits and defects of a top surface of the polarization layer stack.

* * * * *